United States Patent [19]

Kwong

[11] Patent Number: 4,695,404

[45] Date of Patent: Sep. 22, 1987

[54] HYPERCONDUCTIVE FILLED POLYMERS

[75] Inventor: Chung T. Kwong, Pennington, N.J.

[73] Assignee: Amerasia International Technology, Inc., Trenton, N.J.

[21] Appl. No.: 848,783

[22] Filed: Apr. 7, 1986

[51] Int. Cl.[4] .............................................. H01B 1/02
[52] U.S. Cl. .................................... 252/514; 524/439; 106/1.19; 523/137; 523/457; 523/459
[58] Field of Search ........................ 252/514; 524/439; 523/137, 457, 459; 106/1.18, 1.19; 428/901

[56] References Cited

U.S. PATENT DOCUMENTS 4,210,704 7/1980 Chandross et al. ................. 252/514
4,410,457 10/1983 Fujimura et al. .................... 252/514

Primary Examiner—Josephine L. Barr
Attorney, Agent, or Firm—Rosen, Dainow & Jacobs

[57] ABSTRACT

This invention is directed to a polymeric composition comprising a polymeric binder and silver particles and having a volume electrical resistivity of 0.0001 ohm-cm or less.

6 Claims, No Drawings

HYPERCONDUCTIVE FILLED POLYMERS

FIELD OF THE INVENTION

This invention is directed to filled polymers. More particularly, this invention is directed to polymeric compositions comprising filled polymers having extremely high conductivity, said polymers being useful in the fields of electronics, microelectronics, and enclosure packaging thereof.

BACKGROUND OF THE INVENTION

Electromagnetic compatibility in the enclosure level of packaging is the ability of an electronic system or subsystem to readily operate in its intended electromagnetic environment regardless of responding to electrical noise or generating unwanted electrical noise. Electromagnetic interference (EMI) is the impairment of the performance of an electronic system or subsystem by an unwanted electromagnetic disturbance.

It is known that electromagnetic compatibility can be achieved by reducing the EMI below the level that disrupts the proper operation of the electronic system. This compatibility is generally accomplished by means of line filters and/or equipment shields.

In discussing electromagnetic compatibility and EMI, it can be useful to use the terms "emitter" and "susceptor", which refer, to a system or subsystem that generates noise and a system or subsystem that is susceptible to noise, respectively. Any barrier placed between an emitter and a susceptor that diminishes the strength of the interference can be thought of as an EMI shield. How well the shield attenuates an electromagnetic field is referred to as its shielding effectiveness, expressed in decibels (dB). Thus, shielding effectiveness is a measure of the ability of the shield to control radiated electromagnetic energy.

To achieve electromagnetic compatibility in electronics useful in both military and civilian applications, EMI shielding must be considered. Such shielding can be accomplished by incorporating proper choices of metallic components and packaging into the design and by proper selection of EMI gaskets, adhesives, sealants, or coatings. Useful EMI shielding materials are effective due to the presence of silver, silver-plated copper, silver-plated nickel, silver-plated glass, silver-plated inorganic material, nickel, copper, and/or other conductive filler. All of these materials are effective as EMI/RFI components due to their high conductivity. Silver-filled polymers with a lowest volume electrical resistivity (VER) of 0.0002 ohm-cm provide a shielding effectiveness of 60 dB for 0.0001 in. thickness. Reduction of the VER will improve the shielding effectiveness of the material.

Conductive polymers for die-bonding and other microelectronic applications are obtained by filling a sufficient amount of conductive particles into a polymer matrix which is normally insulating that the particles will be in close proximity with one another and thus facilitate current flow. The most conductive polymeric composition achieved to date by a manufacturer contains silver particles. The lowest volume electrical resistivity achieved is 0.0002 ohm-cm for an epoxy resin filled with from about 70 to 90% by weight of silver powder. Such a low resistivity is characteristic of any polymeric conductive material in which the polymeric material is not cured at a temperature above 200° C. for an extended period of time, which curing tends to degrade the physical properties of the material.

Conductive compositions containing silver filler are disclosed in each of U.S. Pat. Nos. 4,407,674 and 4,518,524. The compositions of U.S. Pat. No. 4,407,674 which comprise silver powder of extreme thinness, have a relatively high VER and are thus not especially conductive. U.S. Pat. No. 4,518,524 is directed to electrically conductive silver coatings in which silver and ferro alloy are used as filler or pigment in binder resin.

OBJECTS OF THE INVENTION

It is an object of the invention to provide filled polymer conductors useful for chip-bonding or EMI-shielding or as conductive members of circuits.

It is also an object of the invention to provide filled polymers having conductivity higher than any metal-filled composite.

It is a further object of the invention to provide a silver-filled polymeric material having higher conductivity than any known silver-filled systems.

These and other objects of the invention will become more apparent in the description below.

DETAILED DESCRIPTION OF THE INVENTION

According to the invention described herein, a polymeric composition has desired conductive properties. More particularly, a polymeric composition filled with silver particles achieves a volume electrical resistivity below 0.0001 ohm-cm. The uses of such polymeric material include die attachment, chip-bonding, and other conductive adhesive uses; reproduction of electrical conductive patterns on circuit boards and other conductive ink applications; conductive coating for EMI shielding; and conductive composites for structural uses. The polymeric material according to this invention provides an at least 100% improvement over existing technology.

More particularly, the invention herein is directed to filled polymers having high conductivity wherein silver flakes or powder is dispersed in a polymer matrix. The compositions are prepared from processable liquid polymers that may comprise solvent-based polymers, pre-cured resins, thermosettable polymers, or thermoplastic polymers. Filler is added to the processable liquid polymer, which then solidifies due to solvent evaporation, chemical cross-linking, or mere temperature lowering. Such solidification is referred to hereafter as "curing".

Useful polymers include epoxies, acrylic resins, polyurethanes, silicones, and any thermosettable or thermoplastic polymer, or even non-curing liquids, such as, oils of long-chain hydrocarbons, fluorocarbons, or aromatic structures, or a combination thereof. Preferred polymer materials include silicones, fluorosilicones, acrylic resins, epoxies, and polyurethanes. Acrylic resins useful herein include polymethyl methacrylate, polyethyl methacrylate, poly-n-butyl methacrylate, polyisobutyl methacrylate, poly-n-butyl/isobutyl methacrylate (50:50 copolymer), polymethyl methacrylate copolymers, and other acrylic based polymers, copolymers, and blends.

The silver flakes or powder filler can be any of several commercially available products. Useful silver powder will typically comprise particles having an effective diameter of from about 0.1 to 44$\mu$, preferably from about 0.1 to 25$\mu$I, and useful silver flakes will typically have a thickness of from about 0.1 to 44$\mu$, preferably from about 0.1 to 25μ and a ratio of overall tap density to real specific density of from about 0.05 to 0.50, preferably from about 0.10 to 0.35. The silver flakes should be free from oxidation, inorganic compounds, or other coatings. Moreover, the weight loss of useful silver flakes or powder when fired in a hydrogen or oxygen environment should not exceed 0.1% of achieving a VER less than 0.0002 ohm-cm. The silver flakes or particles in accordance with the invention are at least 95% pure silver, and have a voume electrical resistivity in a compressed free-flow state of not more than 0.0002 ohm-cm.

The introduction of the silver flakes or powder into the polymer matrix should be so thorough that the conductive particles are evenly distributed in the matrix.

The following examples are intended to illustrate the invention and should not be construed as limiting the invention thereto.

EXAMPLES

Example 1

An epoxy resin cured with a suitable curing agent was loaded with silver flakes beyond the electrical percolation level to render them conductive. The silver flakes should have a tap density of 2.5 gm/cc or less.

| Component | Parts by Weight |
| --- | --- |
| Epoxide resin (EPON 929 from Shell Chemical Co.) | 100 |
| Curing agent (Polyamide Versamid 140 from Henkel Corporation) | 100 |
| Silver particles (Silflake #143 from Handy & Harmond, with a tap density of 2.5 gm/cc) | 625 |
| Total: | 825 |

Epoxide resin is first mixed with curing agent by mechanical stirring. Silver particles are then added to the mixture by mechanical stirring. The resulting batch is then roll-milled in a conventional paint roller to ensure uniform dispersion of silver in the resin and curing agent mixture.

Silver flakes #143 from Handy & Harmond, when compressed in an insulating cylinder and conductivity monitored at the ends of the cylinder (compressed VER), showed an extremely high value of $>10^6$ ohm-cm.

When the composition shown above was cured at 25° C. for 24 hours, it showed too high a resistivity to be measured. This can be considered insulating for all practical purposes. However, when the mixture was cured at 150° C. for 5 minutes, the cured mixture showed resistivity of 0.02 ohm-cm.

Thus, for all practical purposes, the silver flake used herein is not very effective for this particular resin structure.

Example 2

The procedure of Example 1 was repeated, with the same mixture and ratio as those of Example 1. The only exception was that Silflake #143 was replaced with commercially available silver particles from A. I. Technology, Inc., (AG-6180) with a tap density of 2.5 gm/cc and a compressed free flow VER of 0.00001 ohm-cm.

The sample was prepared in exactly the same manner as Example 1 and was cured at 25° C. for 24 hours. The resistivity, measured with 4 point probe, was 0.00008 ohm-cm. A sample mixture cured at 150° C. for 5 minutes showed a resistivity of 0.00002 ohm-cm.

A two-component mixture can be made from 100 pbw of epoxide resin and 312.5 pbw of silver particles (AG-6180), with 100 pbw of the curing agent. The mixing procedure would be the same as in Example 1.

Example 3

The procedure of Example 1 was repeated with the following components:

| Component | Parts by Weight |
| --- | --- |
| Epoxide Resin (EPON 828 from Shell Chemical Co.) | 100 |
| Tertiary amine (Benzyl dimethylamine) | 3 |
| Silver particles (AG-6180) | 327 |
| Total: | 430 |

When the composition was cured at 150° C. for 5 minutes, the resistivity was measured as 0.00005 ohm-cm.

A similar mixture of epoxy resin, tertiary amine, and Silflake #143 at the same ratio was cured in the same fashion. The resistivity of the resulting composition was measured as 0.001 ohm-cm.

Example 4

The procedure of Example 1 was repeated with the following components:

| Component | Parts by Weight |
| --- | --- |
| Epoxide resin (QUARTEX ® 1010 from Dow Chemical Co.) | 100 |
| Curing agent (Imidazole EMI-24 from BASF Wyandotte Co.) | 4 |
| Silver particles (AG-6180) | 330 |
| Total: | 434 |

The composition was cured at 150° C. for 5 minutes, and the cured composition was found to have a resistivity of 0.00004 ohm-cm.

Example 5

The procedure of Example 1 was repeated with the following components:

| Component | Parts by Weight |
| --- | --- |
| Novalac epoxide resin (DEN 431 from Dow Chemical Co.) | 100 |
| Anhydride curing agent (NMA from Buffalo Color, Inc.) | |
| Accelerator (Benzyl dimethylamine) | 3 |
| Silver particles (AG-6180) | 710 |
| Total | 913 |

The resulting mixture was cured at 150° C. for two hours, and the cured composition was found to have a resistivity of 0.000012 ohm-cm.

Example 6

The procedure of Example 1 was repeated with the following components:

| Component | Parts by Weight |
| --- | --- |
| RTV (#738 from Dow Corning Co.) | 100 |
| Silver particles (AG-6180) | 400 |
| Total: | 500 |

The resulting mixture was moisture-cured at 25° C., 50% relative humidity, for 48 hours. The cured composition was found to have a resistivity of 0.00008 ohm-cm.

It is clear from the above example that the particular polymers or other binders is not critical to the conductivity of the polymer-silver compositions herein. It is also clear that solvent can easily be added to aid the flow properties of the compositions.

The preceding specific embodiments are illustrative of the practice of the invention. It is to be understood, however, that other expedients known to those skilled in the art or disclosed herein, may be employed without departing from the spirit of the invention or the scope of the appended claims.

I claim:

1. A polymeric composition in the form of paste, liquid, or preformed film, comprising a polymeric binder and silver particles evenly distributed in said binder, said binder being prepared from a processable liquid polymer, said silver particles comprising at least 95% pure silver and having a volume electrical resistivity in the compressed free flow state of not more than 0.0002 ohm-cm, said composition having a stable volume electrical resistivity of 0.0001 ohm-cm or less.

2. A composition of claim 1 wherein said polymeric binder comprises an epoxide resin cured with suitable curing agents and silver flakes at weight fraction loading of from about 70 to 90% by weight, which for this particular flake structure is at least 5% beyond its electrical percolation threshold.

3. The composition of claim 1 wherein the material of said polymeric binder is selected from the group consisting of epoxies, acrylic resins, silicones, fluorosilicones, polyurethanes, oils of long-chain hydrocarbons, aromatics, or flurocarbons, 4. The composition of claim 1 which is an adhesive, sealant, coating, or gasket.

5. The composition of claim 1 wherein said composition comprises part of a B-stage preform, cured structure, or circuit board.

6. An electrically conductive polymeric composition having an stable volume electrical resistivity in the cured state of not more than 0.0001 ohm-cm, said composition comprising a polymeric binder filled with a conductively effective amount of fine silver particles, said silver particles in a compressed free-flow state having a volume electrical resistivity of not more than 0.0002 ohm-cm, and being evenly distributed in said binder, said binder being formed of a processable liquid polymer.

* * * * *

UNITED STATES PATENT AND TRADEMARK OFFICE
CERTIFICATE OF CORRECTION

PATENT NO. : 4,695,404
DATED : Sept., 22, 1987
INVENTOR(S) : Chung T. Kwong

It is certified that error appears in the above-identified patent and that said Letters Patent is hereby corrected as shown below:

ON THE TILE PAGE:

Item [75] Inventors' name should read --Kwong-Tai Chung--.

Signed and Sealed this

Sixteenth Day of May, 2000

Attest:

Q. TODD DICKINSON

Attesting Officer

Director of Patents and Trademarks